United States Patent
Guccione et al.

(10) Patent No.: US 6,351,143 B1
(45) Date of Patent: Feb. 26, 2002

(54) CONTENT-ADDRESSABLE MEMORY IMPLEMENTED USING PROGRAMMABLE LOGIC

(75) Inventors: Steven A. Guccione, Austin, TX (US); Delon Levi, Santa Clara, CA (US); Daniel J. Downs, Longmont, CO (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/882,615

(22) Filed: Jun. 15, 2001

Related U.S. Application Data

(62) Division of application No. 09/562,646, filed on May 1, 2000.

(51) Int. Cl.[7] ........................... G11C 15/00; G06F 13/00
(52) U.S. Cl. ............................ 326/40; 711/108; 365/49
(58) Field of Search ........................ 326/38–41; 365/49, 365/189.08; 711/2, 108, 156; 712/32, 37, 211, 230

(56) References Cited

U.S. PATENT DOCUMENTS

| | | | | |
|---|---|---|---|---|
| 5,889,413 A | | 3/1999 | Bauer ........................... | 326/40 |
| 5,914,616 A | | 6/1999 | Young et al. .................. | 326/41 |
| 6,144,573 A | * | 11/2000 | Heile ............................. | 365/49 |
| 6,147,890 A | * | 11/2000 | Kawana et al. ................ | 365/49 |
| B16,191,611 | | 2/2001 | Altaf ............................. | 326/39 |

OTHER PUBLICATIONS

Steven A. Guccione et al., "JBits: Java based interface for reconfigurable computing", available from Xilinx, Inc. 2100 Logic Drive, San Jose, CA 95124.

Steven A. Guccione et al., "Software for Reconfigurable Computing", available from Xilinx, Inc. 2100 Logic Drive, San Jose, CA 95124, Apr. 10, 1997.

Xilinx Application Note: Jean–Louis Brelet, "An Overview of Multiple CAM Designs in Virtex Family Devices," XAPP 201, Version 1.1, 1999, pp 1–6.

Xilinx Application Note: Marc Defossez, "Content Addressable Memory (CAM) in ATM Applications", XAPP202, Version 1.1, 1999, pp. 1–14.

Xilinx Application Note: Jean–Louis Brelet and Bernie New "Designing Flexible, Fast CAMs with Virtex Family FPGAs", XAPP203, Version 1.1, 1999, pp. 1–17.

Xilinx Application Note: Jean–Louis Brelet, "Using Block SelectRAM+ for High–Performance Read/Write CAMs", XAPP204, Version 1.1, 1999, pp. 1–22.

(List continued on next page.)

*Primary Examiner*—Michael Tokar
*Assistant Examiner*—Daniel D. Chang
(74) *Attorney, Agent, or Firm*—Arthur J. Behiel; Edel M. Young

(57) ABSTRACT

Described are systems and methods that take advantage of the run-time reconfigurability of modern programmable logic devices to efficiently implement content-addressable memory (CAM) circuits. Rather than using configurable logic to compare CAM entries stored in flip-flops, a CAM in accordance with the invention uses configurable logic for both data storage and comparison. A CAM in accordance with one embodiment of the invention includes a number of programmable look-up tables on a programmable logic device collectively configured to produce a "match" signal in response to data provided on a series of data input terminals. Configuration data determines the particular pattern to which the CAM responds, so new CAM entries are introduced by configuring (or reconfiguring) one or more of the look-up tables. A processor connected to the PLD responds to new CAM entries by executing instructions that first translate the new CAM entries into configuration data and then employ the configuration data to reprogram the PLD.

10 Claims, 7 Drawing Sheets

OTHER PUBLICATIONS

JBits Tutorial entitled "JBits Xilinx Reconfigurable Computing Platform", Sep. 9, 1999, available from Xilinx, Inc. 2100 Logic Drive, San Jose, CA 95124.

Steven A. Guccione and Delon Levi, "The Advantages of Run–Time Reconfiguration", available from Xilinx, Inc. 2100 Logic Drive, San Jose, CA 95124.

Steven A. Guccione and Delon Levi, "Run–Time Parameterizable Cores", available from Xilinx, Inc. 2100 Logic Drive, San Jose, CA 95124.

Steven A. Guccione and Delon Levi, "XBI: A Java–Based Interface to FPGA Hardware", available from Xilinx, Inc. 2100 Logic Drive, San Jose, CA 95124, Nov. 1998.

Steven A. Guccione and Delon Levi, "JBits: A Java–Based Interface to FPGA Hardware", available from Xilinx, Inc. 2100 Logic Drive, San Jose, CA 95124.

* cited by examiner

US 6,351,143 B1

CONTENT-ADDRESSABLE MEMORY IMPLEMENTED USING PROGRAMMABLE LOGIC

This Appln is a Div. of Ser. No. 09/562,646 filed May 1, 2000.

FIELD OF THE INVENTION

This invention relates generally to content-addressable memory (CAM), and in particular to CAM implementations on programmable logic devices.

BACKGROUND

Programmable logic devices (PLDs) are a well-known type of digital integrated circuit that may be programmed by a user (e.g., a logic designer) to perform specified logic functions. PLDs are becoming ever more popular, largely because they require less time to implement than semi-custom and custom integrated circuits.

FIG. 1 is a block diagram of one type of PLD, a field-programmable gate array (FPGA) 100. FPGA 100 includes an array of configurable logic blocks (CLBs) 105 that are programmably interconnected to each other and to programmable input/output blocks (IOBs) 110. The interconnections are provided by configurable horizontal and vertical interconnect lines 115 and 120, which may be connected to one another using programmable interconnect points (PIPs) 125. This collection of configurable elements may be customized by loading configuration data into internal configuration memory cells (not shown) that define how the CLBS, PIPS, and IOBs are configured. The configuration data may be read from memory (e.g., an external PROM) or written into FPGA 100 from an external device. The collective states of the individual memory cells then determine the function of FPGA 100. Some FPGAs also include block RAMS 130 that may be connected to other resources using interconnect lines.

FIG. 2 is a schematic diagram of a "slice" 200, one of two identical slices that make up an exemplary CLB in the Virtex™ family of devices available from Xilinx, Inc. All of the terminals to and from slice 200 are connected to horizontal or vertical interconnect lines (see FIG. 1) through which they can be programmably connected to various other components within the FPGA.

Slice 200 includes two 4-input look-up tables (LUTS) 205A and 205B. LUTs 205A and 205B are each capable of implementing any arbitrarily defined Boolean function of up to four inputs. In addition, each of LUTs 205A and 205B can provide a 16×1-bit synchronous RAM. Furthermore, the two LUTs can be combined to create a 16×2-bit or 32×1-bit synchronous RAM, or a 16×1-bit dual-port synchronous RAM.

Slice 200 also includes a pair of sequential storage elements 210A and 210B that can be configured either as edge-triggered D-type flip-flops or as level-sensitive latches. The D inputs can be driven either by LUTs 205A and 205B or directly from input terminals, bypassing LUTs 205A and 205B. Each storage element includes an initialization terminal INIT, a reverse-initialization terminal R, an enable-clock terminal EC, and a clock terminal conventionally designated using the symbol ">". The INIT terminal forces the associated storage element into an initialization state specified during configuration; the reverse-initialization terminal R forces the storage element in the opposite state as the INIT terminal. Terminals INIT and R can be configured to be synchronous or asynchronous, and the sense of each control input can be independently inverted.

As discussed above in connection with FIG. 1, configuration memory cells define the functions of the various configurable elements of slice 200. An exemplary two-input multiplexer 225 includes a pair of MOS transistors having gate terminals controlled by inverting and non-inverting terminals of configuration memory cell 230. Other configuration memory cells used to define the functions of the remaining programmable elements of slice 200 are omitted for brevity. The use of configuration memory cells to define the function of programmable logic devices is well understood in the art.

A detailed discussion of slice 200 is not necessary for understanding the present invention, and is therefore omitted for brevity. For a more detailed treatment of the operation of many components within slice 200, see the following U.S. patents and applications:

Ser. No. 08/786,818 entitled "Configurable Logic Block with AND Gate for Efficient Multiplication in FPGAs," by Chapman et al., Ser. No. 08/754,421, now U.S. Pat. No. 5,889,413 entitled "Lookup Tables Which Double as Shift Registers," by Bauer; and Ser. No. 08/806,997, now U.S. Pat. No. 5,914,616 entitled "FPGA Repeatable Interconnect Structure with Hierarchical Interconnect Lines," by Young, et al.

Each of the foregoing documents is incorporated herein by reference.

Content Addressable Memories (CAMs) are a class of parallel matching circuits. CAMs are traditionally employed in cache controllers for central processing units (CPUs). More recently, CAMs have become popular for use in telecommunications and networking. For example, as data packets arrive into a network router, processing of these packets typically depends on the network destination address of the packet. Because of the large number of potential addresses, and increasing performance demands, CAMs are used to retrieve the destination addresses of packets to speed data access.

CAM circuits are similar in structure to traditional random-access memory (RAM) circuits. Like RAM, CAM may be used to store binary data. Unlike RAM, however, CAM provides a "match mode" that permits all of the data in CAM to be searched in parallel. In the match mode, each memory location in the CAM is compared in parallel with some value; if the value is found in one of the memory locations, the CAM produces a "match" signal.

In some CAM implementations, it is desirable to know the address of the memory location in which data is found. Thus, rather than producing a simple match signal, some CAM implementations supply the address of the matching data. In a sense, this is functionally opposite to that of a typical RAM: that is, RAM supplies data in response to an address, whereas CAM supplies an address in response to data. FIGS. 3A and 3B respectively depict a RAM 300 and a CAM 310 to illustrate the relative functionality of RAM and CAM.

CAM is a type of digital circuit, and may therefore be implemented in a programmable logic device, such as FPGA 100 of FIG. 1. The general approach is to provide an array of registers for data storage. A collection of comparators then determines whether a given input sample matches data in the registers.

FIG. 4 depicts an illustrative CAM circuit 400 implemented on an FPGA. CAM circuit 400 includes N registers R(1) through R(N) connected to N respective comparators C(1) through C(N). Registers R(1)–R(N) are typically made up of flip-flops, and comparators C(1)–C(N) are typically combinatorial logic. The flip-flops and combinatorial logic are generally located within the CLBs of an FPGA. For those implementations that require an address in addition to match notification, a decoder 410 connected to each match line M(1)–M(N) decodes the match-line signals to produce a unique address for each match. For a more detailed discussion of CAM designs for use in programmable logic devices, see:

"An Overview of Multiple CAM Designs in Virtex Family Devices," by Jean-Louis Brelet, XAPP 201, Sep. 23, 1999 (Version 1.1);

"Content Addressable Memory (CAM) in ATM Applications," by Marc Defossez, XAPP202, Sep. 23, 1999 (Version 1.1);

"Designing Flexible, Fast CAMs with Virtex Family FPGAs," by Jean-Louis Brelet & Bernie New, XAPP203, Sep. 23, 1999 (Version 1.1); and "Using Block SelectRAM+ for High-Performance Read/Write CAMs," by Jean-Louis Brelet, XAPP204 (Version 1.1) Oct. 1, 1999.

The above documents are incorporated herein by reference.

Conventional FPGA CAM circuits are viable. However, implementing comparators using programmable logic produces circuits that are too large for some applications. Furthermore, FPGA CAMs that rely on flip-flops for data storage are restricted by the number of flip-flops in the FPGA. While this is adequate for small designs, larger CAMs quickly deplete the resources of even the largest FPGAs. There is therefore a need for a more space efficient means of implementing CAMs using programmable logic.

SUMMARY

The present invention makes use of the run-time reconfigurability of modern programmable logic devices to efficiently implement a CAM circuit using programmable logic. Rather than using configurable logic to compare CAM entries stored in flip-flops, a CAM in accordance with the invention uses reconfigurable logic for both data storage and comparison. Consequently, the number of available data registers (e.g., flip-flops) does not limit CAM size.

Reducing or eliminating the need for data registers preserves registers for other tasks. Moreover, the comparison circuitry need not allocate input terminals to register outputs, and can therefore accept a greater number of data bits. Conventional CAM designs instantiated in programmable logic require that at least half of the compare-circuit input terminals connect to storage registers, leaving the remaining terminals for data input. In contrast, compare circuitry in CAM designs in accordance with the invention use more than half (and typically all) of their input terminals for data input. Compare circuits in accordance with the invention therefore pack more efficiently into programmable logic.

A CAM in accordance with one embodiment of the invention includes a number of programmable look-up tables on a programmable logic device collectively configured to produce a "match" signal in response to data provided on a series of data input terminals. Configuration data determines the particular pattern to which the CAM responds, so new CAM entries are introduced by configuring (or reconfiguring) one or more of the look-up tables. A processor connected to the PLD responds to new CAM entries by executing instructions that first translate the new CAM entries into configuration data and then employ the configuration data to reprogram the PLD.

Their reconfigurable nature allows CAM circuits in accordance with the invention to be dynamically sized, even at run-time (i.e., even when the CAM circuit is operational). Dynamic sizing opens the possibility of not only changing the contents of the reconfigurable CAM (RCAM) during operation, but also of changing the size and shape of the RCAM circuit itself. RCAM circuits are therefore analogous to dynamic memory allocation in RAM: it is possible to "allocate" and "free" CAM resources as needed by an application.

This summary does not limit the invention, which is instead defined by the appended claims.

DETAILED DESCRIPTION

The present invention makes use of the run-time reconfigurability of modern programmable logic devices to efficiently implement a CAM circuit in programmable logic. Rather than using configurable logic to compare CAM entries stored in synchronous storage elements, a CAM in accordance with the invention uses configurable logic for both data storage and comparison. The embodiments described herein are instantiated on FPGAs, but other types of programmable logic devices might also be used.

Figure 5:
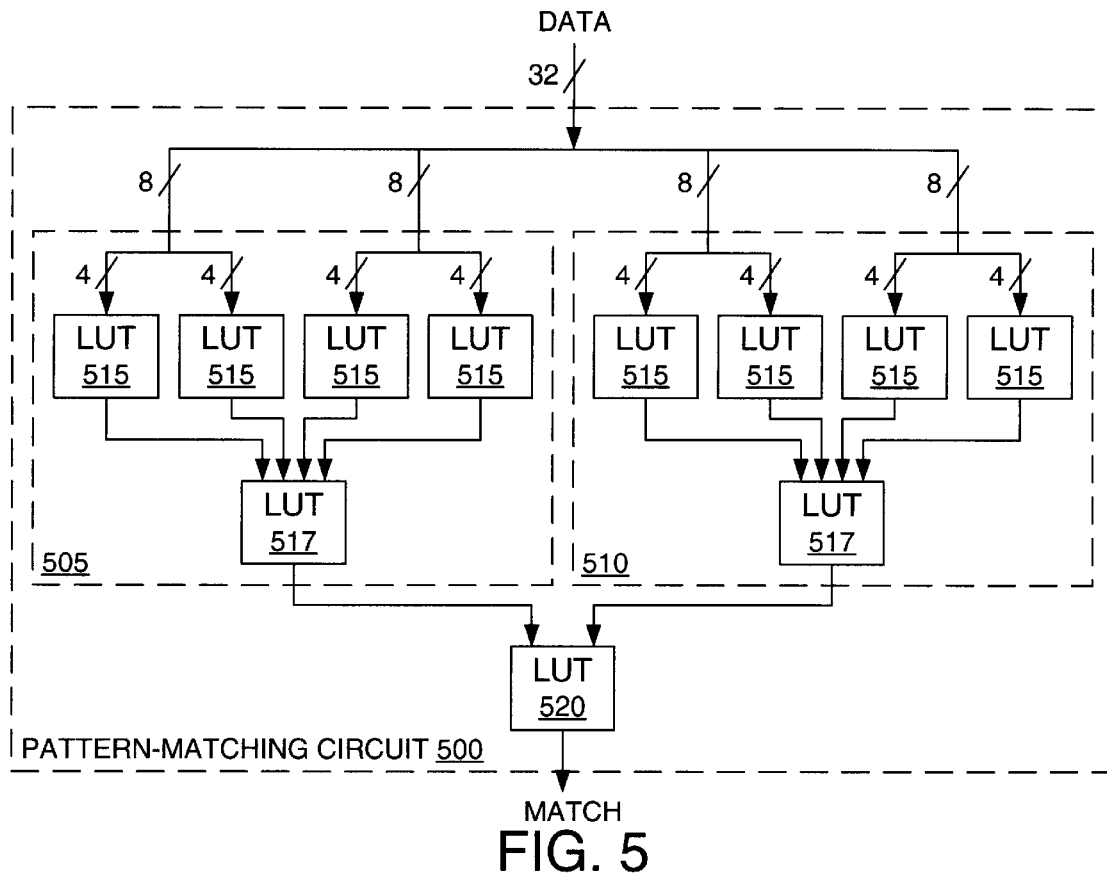
FIG. 5 depicts a pattern-matching circuit 500 used in a CAM implementation in accordance with an embodiment of the invention.

FIG. 5 depicts a pattern-matching circuit 500 used in a CAM implementation in accordance with an embodiment of the invention. Circuit 500 includes a pair of 16-bit LUTs 505 and 510, each in turn made up of five smaller LUTs 515 and 517. Circuit 500 also includes a LUT 520 connected to the output terminals of LUTS 505 and 510.

Pattern-matching circuit 500 is configured to output a logic one "match" signal when presented with a selected 32-bit pattern on data line DATA. Pattern-matching circuit 500 assumes a basic four-input LUT structure; other implementations, including using special-purpose hardware such as carry chains, are possible and may increase speed and reduce circuit area.

Pattern-matching circuit 500 requires one LUT input terminal per matched bit. In the case of 32-bit data, such as an Internet-Protocol (IP) address, circuit 500 uses eight four-input LUTs 515 to provide the matching, and three additional four-input LUTs 517 and 520 to AND the outputs of LUTs 515 to produce a match signal. Note that pattern-matching circuit 500 does not require any registers for comparison; instead, the various LUTs are configured to produce the match signal upon receipt of the appropriate data. Thus, pattern-matching circuit 500 provides both data storage and data comparison without dedicated data registers (e.g., flip-flops or other synchronous storage elements).

Reducing or eliminating the need for data registers is beneficial for at least two reasons. First, the unused registers are preserved for other tasks. Second, the comparison circuitry need not allocate input terminals to register outputs, and can therefore accept a greater number of data bits. Conventional CAM designs instantiated in programmable logic require that at least half of the compare-circuit input terminals connect to storage registers, leaving the remaining input terminals for data input. In contrast, compare circuitry in CAM designs in accordance with the invention use more than half (and typically all) of their input terminals for data input. Compare circuits in accordance with the invention therefore pack more efficiently into programmable logic.

Figure 6A:
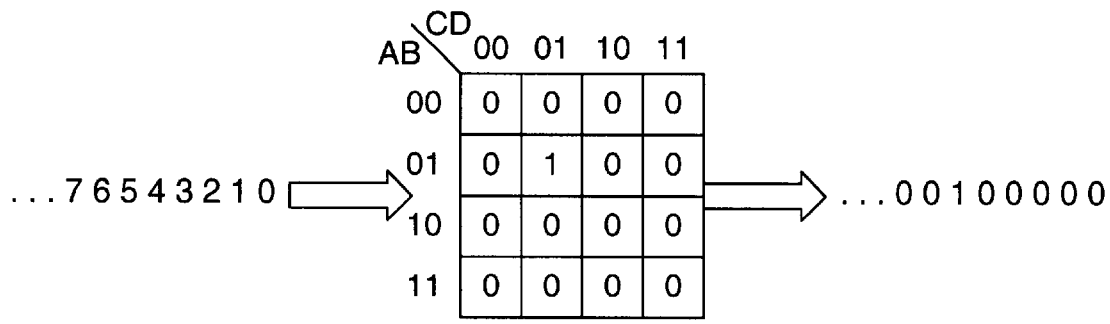
FIG. 6A graphically depicts a LUT 600 having four input terminals A, B, C, and D, configured to output logic one when the input is binary five (0101).

FIG. 6A graphically depicts a LUT 600 having four input terminals A, B, C, and D. LUT 600 is configured to output a logic one when the pattern on terminals A–D is a binary five, or "0101." In other words, LUT 600 produces a match signal when the pattern on the input matches a binary five. LUT 600 might be any of the four-input LUTs 515, 517, and 520 of FIG. 5, for example.

Figure 6B:
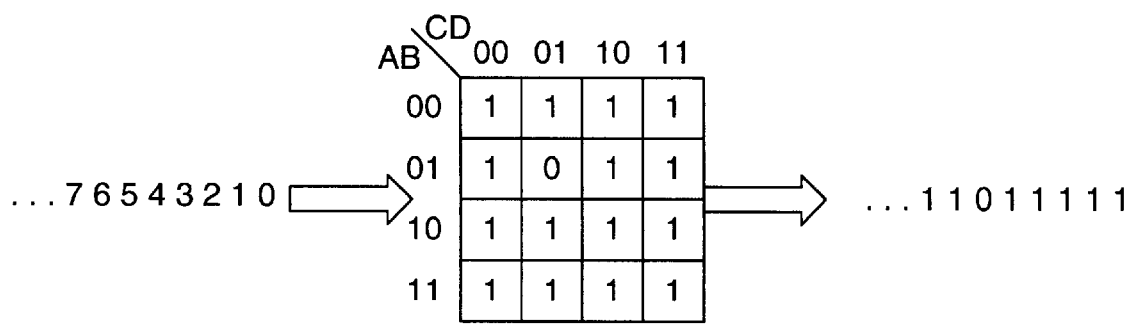
FIG. 6B graphically depicts LUT 600 of FIG. 6A configured to output a logic one when the pattern on terminals A–D is any number other than a binary five.
Figure 4:
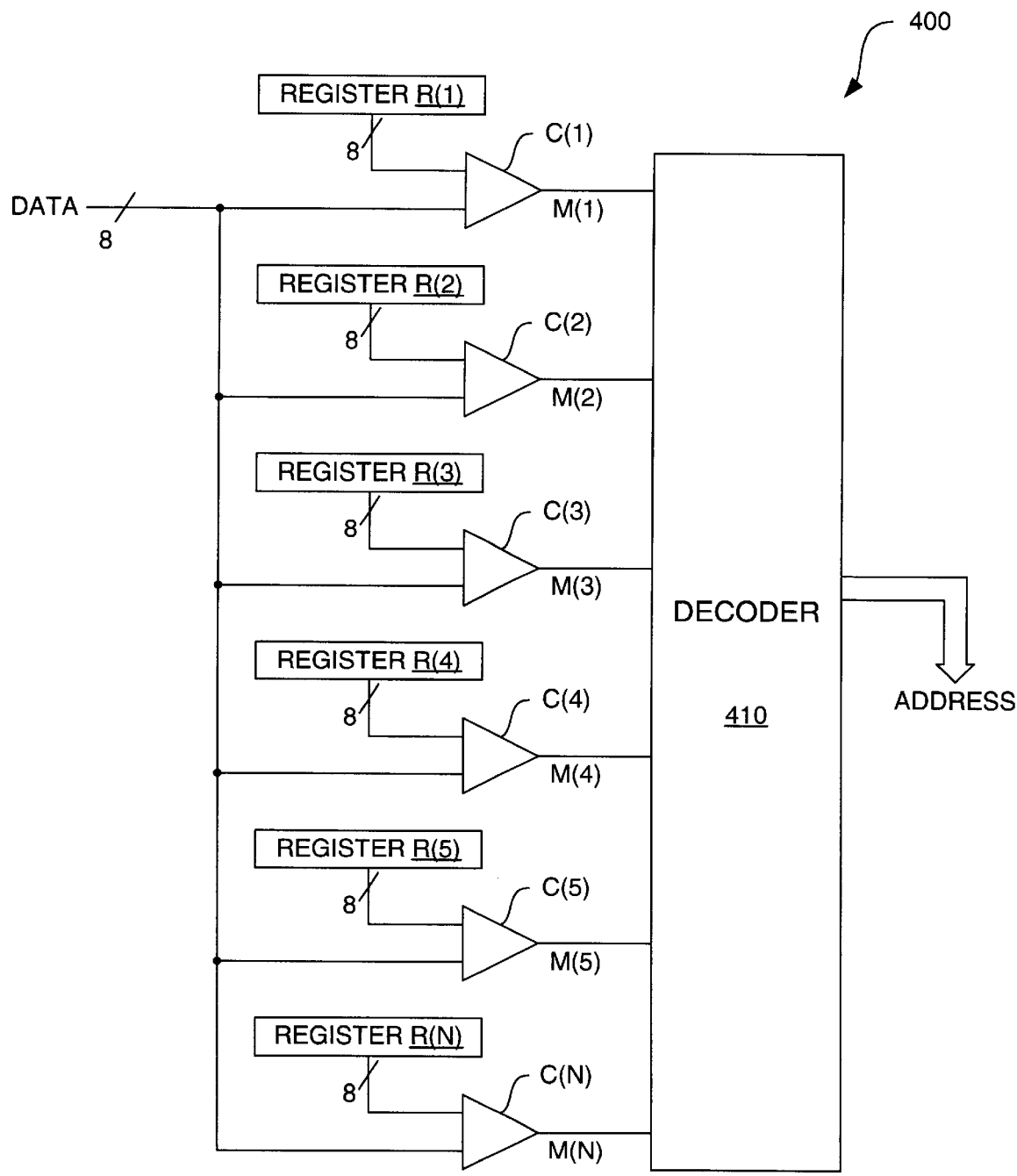
FIG. 4 (prior art) depicts a CAM circuit 400 implemented on an FPGA.

FIG. 6B graphically depicts LUT 600 of FIG. 6A configured to output a logic one when the pattern on terminals A–D is any number other than a binary five. FIGS. 6A and 6B illustrate that LUT 600 provides more flexible matching schemes than the simple match described above in connection with FIG. 4. FIG. 6B demonstrates the ability to embed a "mask" in the configuration of a LUT, permitting consecutive or arbitrary data values to be matched using a single LUT, or using a single pattern-matching circuit like circuit 500 of FIG. 5. For example, LUT 600 could be used to match any of the range of binary numbers from zero to three by storing a logic one at each address location 0000 to 0011. (Such a mask could be specified as "00**", where "*" is a wildcard that matches either a one or a zero.) Multiple-address matching can be extended to larger numbers, such as 32-bit IP addresses in a selected range.

Figure 7:
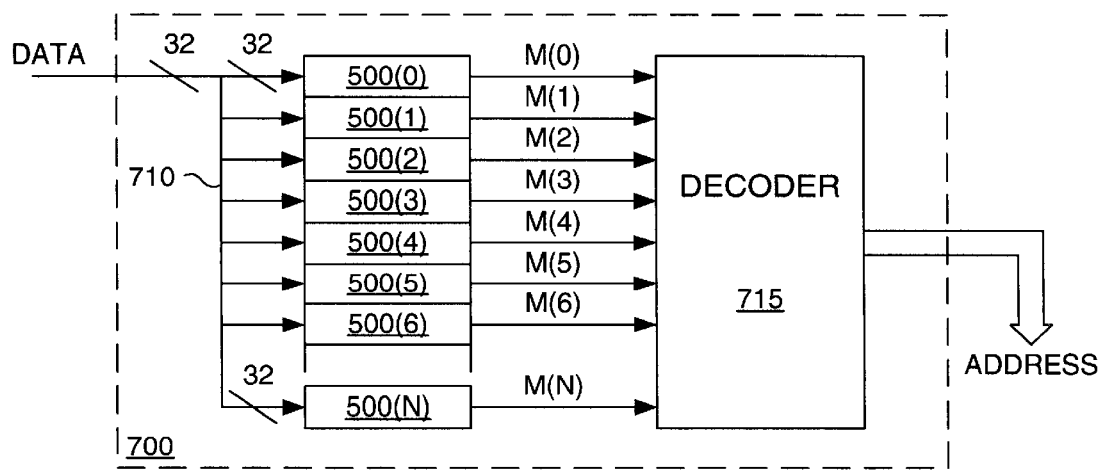
FIG. 7 depicts a CAM 700 that includes an array of pattern-matching circuits 500(0)–500(M), each of which is an instance of circuit 500 of FIG. 5.

FIG. 7 depicts a CAM 700 that includes an array of pattern-matching circuits 500(0)–500(M), each of which is an instance of circuit 500 of FIG. 5. Each of pattern-matching circuits 500(0)–500(M) includes a match output M(x) that produces a match signal if the associated pattern-matching circuit is configured to produce a logic one in response to the data on a data bus 710. If necessary, a conventional decoder 715 decodes the signals from match outputs M(0)–M(N) to produce an address that corresponds to the matched data. Decoder 715 can be part of the device in which pattern-matching circuits 500(0)–500(M) are instantiated.

CAM 700 is created by instantiating the appropriate logic on a programmable logic device. Then, each time a new data entry is added to the CAM, the programmable logic device is reprogrammed to include a new pattern-matching circuit that produces a match signal in response to the new data. The new pattern-matching circuit can be added using unused logic resources, or can over-write an older pattern-matching circuit. In one embodiment, the CAM employs a conventional least-recently-used (LRU) counter to identify which CAM entry to over-write.

CAM circuits in accordance with the invention can be sized while the CAM circuit is operational. Reconfigurable CAM (RCAM) circuits in accordance with the invention are therefore analogous to dynamic memory allocation in RAM: it is possible to "allocate" and "free" CAM resources as needed by an application.

JBits is a set of Java classes that provide an Application Program Interface (API) into the Xilinx VirtexFPGA family bitstream. This interface operates on either bitstreams generated by Xilinx design tools, or on bitstreams read back from programmable hardware. JBits provides the capability of designing and modifying circuits in Xilinx Virtex series FPGA devices. This capability extends to dynamic reconfiguration, which is to say that FPGA circuit configurations can be modified while the FPGA is in use.

Figure 1:
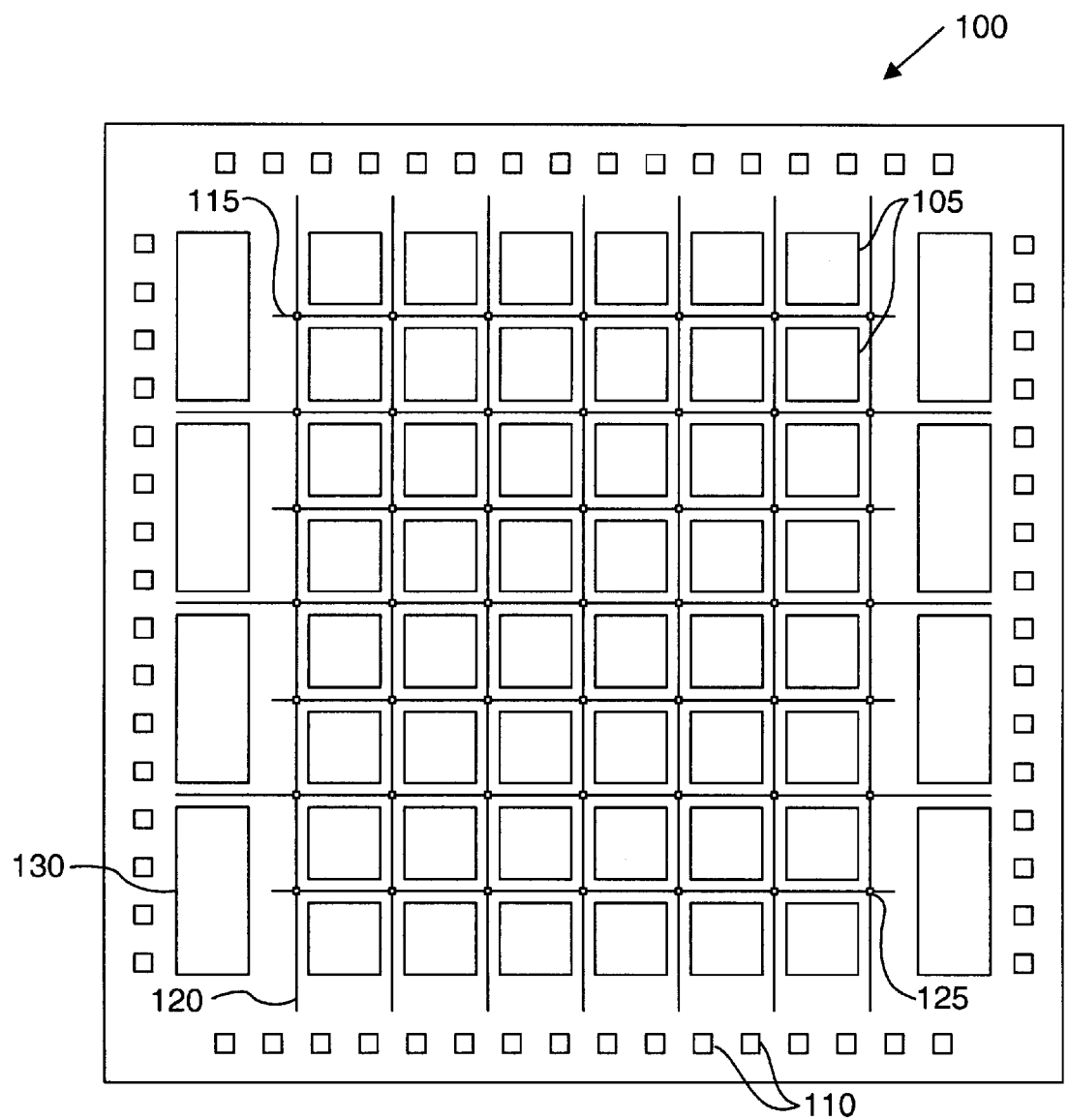
FIG. 1 (prior art) is a block diagram of one type of PLD, a field-programmable gate array (FPGA) 100.
Figure 2:
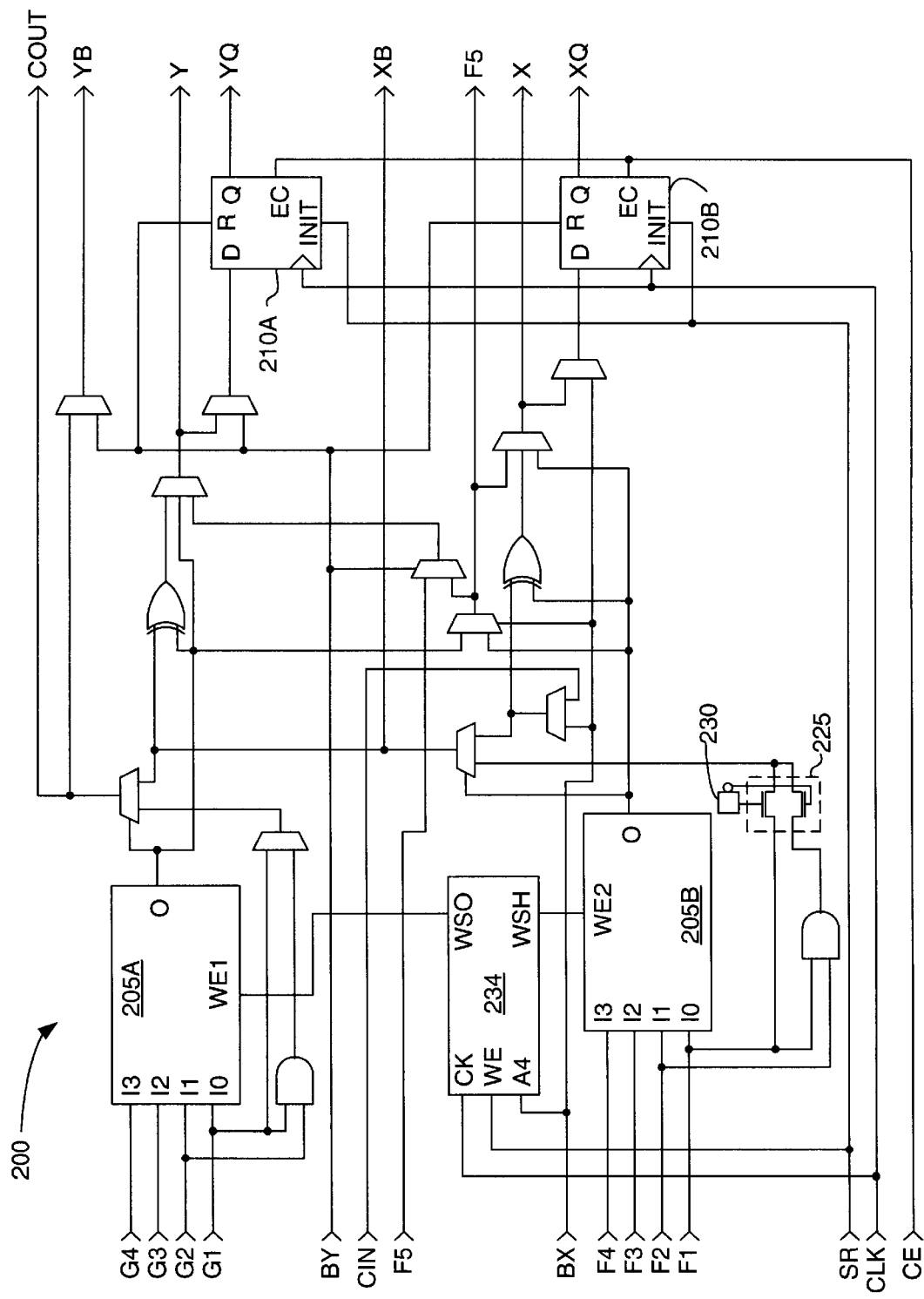
FIG. 2 (prior art) is a schematic diagram of a "slice" 200, two slices making a CLB in the Virtex™ family of devices available from Xilinx, Inc.
Figure 3A:
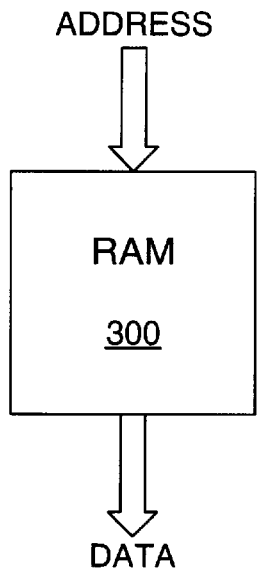
FIG. 3A (prior art) depicts the functionality of a RAM 300.
Figure 3B:
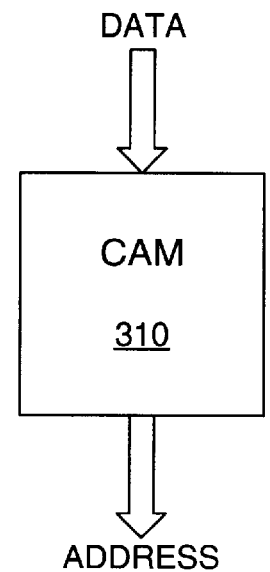
FIG. 3B (prior art) depicts the functionality of a CAM 310.

The programming model used by JBits is a two-dimensional array of Configurable Logic Blocks (CLBs) similar to that shown above in FIG. 1. Each CLB is referenced by a row and column, and all configurable resources in the selected CLB may be set or probed. Additionally, control of all routing resources adjacent to the selected CLB is made available. Because the JBits code is written in Java, compilation times are very fast, and because control is at the CLB level, bitstreams can typically be modified or generated very quickly. JBits is available from Xilinx, Inc., of San Jose, Calif. For a more detailed discussion of JBits, see the JBits tutorial entitled "JBits Xilinx Reconfigurable Computing Platform" (Sep. 9, 1999), also available from Xilinx, Inc., which is incorporated herein by reference.

Figure 8:
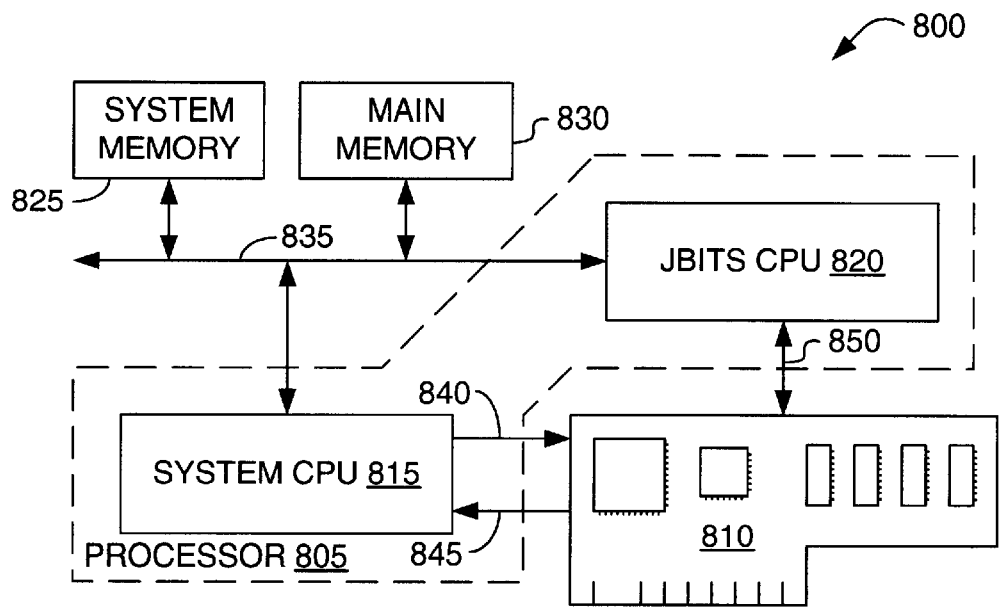
FIG. 8 depicts a system 800 in which a processor 805 employs a CAM instantiated in reconfigurable logic 810.

FIG. 8 depicts a system 800 in which a processor 805 employs a CAM instantiated in reconfigurable logic 810 (e.g., a circuit board bearing a Virtex FPGA). Processor 805 is depicted as a pair of central-processing units (CPUs), a system CPU 815 for executing general-purpose instructions and a JBits CPU 820 for executing instructions that configure and reconfigure reconfigurable logic 810. In other embodiments, a single processor provides the functionality of both CPUs 815 and 820.

CPUs 815 and 820 connect to conventional system memory 825 (e.g., static RAM) and main memory 830 (e.g., a disk drive) via a system bus 835. A data bus 840 and an address bus 845 connect CPU 815 to reconfigurable logic 810. CPU 820 connects to the reconfiguration port 850 of reconfigurable logic 810. This connection enables CPU 820 to configure and reconfigure configurable logic 810 to perform any of myriad logic functions. In some embodiments, CPU 820 can also read data from reconfigurable logic 810.

System CPU 815 executes general instructions, such as program modules. Generally, program modules include routines, programs, objects, components, data structures, etc., that perform particular tasks or implement particular abstract data types. Some such modules execute faster if the processor upon which they execute has access to a CAM.

Like CPU 815, CPU 820 executes general instructions. In one embodiment, CPU 820 executes programs written in the JBits API. Using JBits instructions loaded into system memory 825, CPU 820 configures reconfigurable logic 810 to implement one or more CAM entries. CPU 820 then reconfigures reconfigurable logic 810 to include additional entries as they arise. Pattern-matching circuit 500 of FIG. 5 is an embodiment of an appropriate CAM entry for a 32-bit CAM instantiated on reconfigurable logic 810. New entries can be added to unused configurable logic or can overwrite previous entries.

Figure 9:
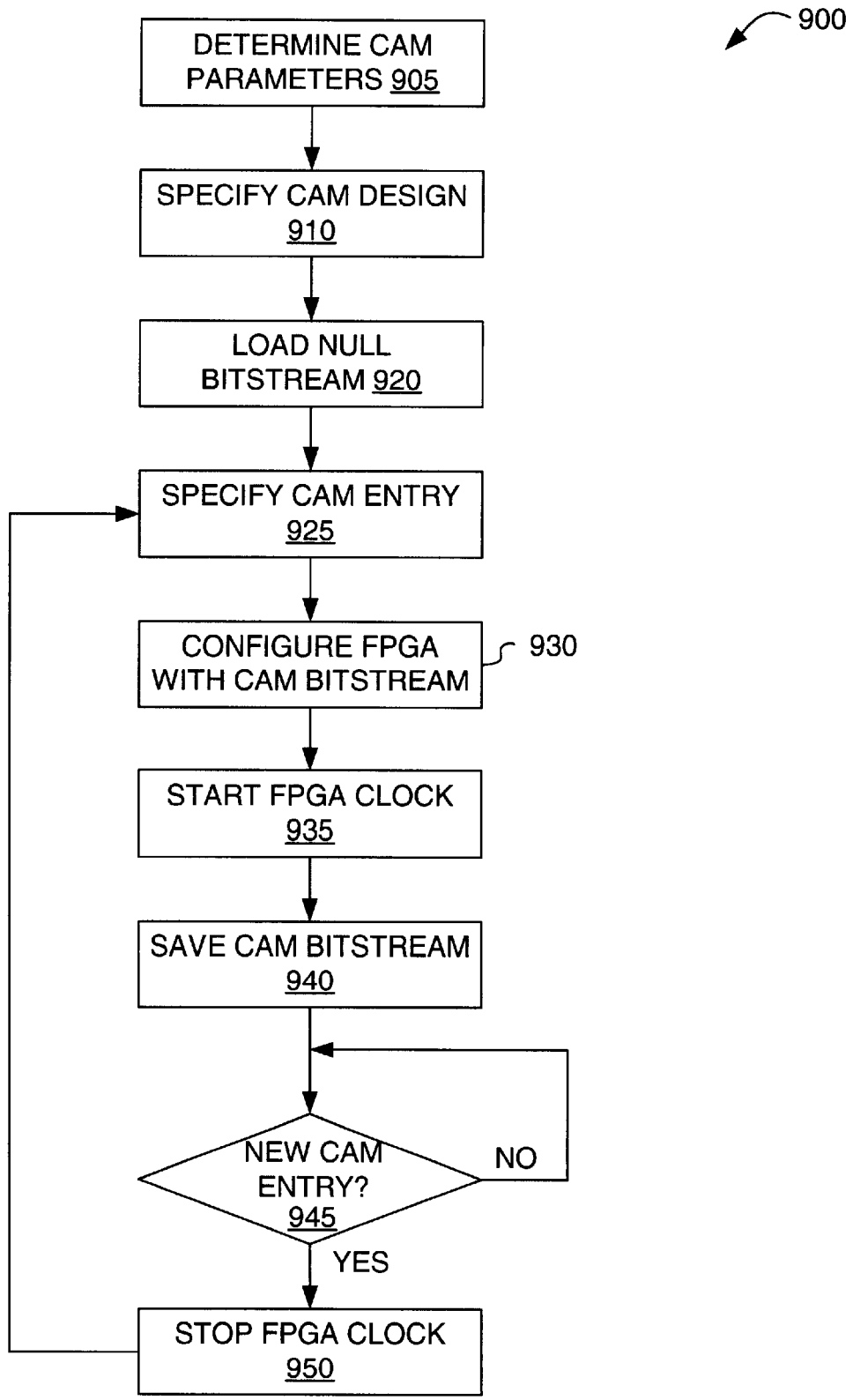
FIG. 9 is a flowchart 900 depicting the operation of system 800 of FIG. 8.

FIG. 9 is a flowchart 900 depicting the operation of system 800 of FIG. 8. Those skilled in computer programming will be able to implement the flow of FIG. 9 using appropriate software, such as the aforementioned JBits API. For Xilinx FPGAs, JBits instructions interface with reconfigurable logic 810 using "XHWIF," the standard hardware interface to Xilinx FPGA-based hardware. Once an XHWIF interface is defined for a particular piece of hardware, JBits applications that use the XHWIF interface will also typically run on the new hardware, usually without modification or recompilation. Finally, part of the XHWIF package is a TCP/IP-based remote network access support. Once the XHWIF interface is ported to new hardware, the remote server and remote networked access to hardware are also automatically supported. This aspect of XHWIF is important for some embodiments of the invention, one of which is discussed below in connection with FIG. 10. See the above-incorporated JBits tutorial for a more detailed discussion of the XHWIF hardware interface.

Returning to FIG. 9, the first step (905) is to determine the CAM parameters appropriate for a given task. For example, conventional networks, such as those that employ the TCP/IP communications protocol, route information using 32-bit headers. This number of input terminals has therefore been selected as a convenient example in FIGS. 5 and 6. Also of interest is the number of CAM entries that will be required for a given application. The capacity of the reconfigurable logic device or devices should be selected to satisfy this need. As an example, a Virtex V1000 FPGA can be configured to include three thousand 32-bit CAM entries, or one thousand 64-bit CAM entries.

Once a programmer has selected appropriate CAM parameters, the CAM design is specified in a Java program using the JBits API (step 910). This program extracts device configuration data from a bitstream file. Before the first CAM entry is instantiated, the program, running on CPU 820 using instructions in memory 825, loads a "null," or empty, bitstream into memory 825 (step 920). The null bitstream is then modified (step 925)—according to the CAM design specified—using the JBits API. The result is a bitstream file that specifies the CAM entry in a format appropriate for reconfigurable logic 810. CPU 820 then configures reconfigurable logic 810 using the bitstream file (step 930) and allows reconfigurable logic 810 to run the new design by starting the system clock (step 935) of reconfigurable logic 810. Once downloaded to the hardware, the CAM design can be debugged using the BoardScope hardware debugger available from Xilinx, Inc. See the above-incorporated JBits tutorial for more information on the BoardScope hardware debugger.

The input bitstream can be a null bitstream, as in step 920, or a bitstream specifying an existing design. When a null bitstream is used, the JBits API builds the entire design. Alternatively, the JBits API can also be used to modify portions of an existing design. Designers start with the bitstream for the existing design. In the example of FIG. 9, the bitstream file generated to instantiate the previous pattern-matching circuit or circuits is saved (step 940) for later modification.

Upon receipt of a new CAM entry from system CPU 815 (step 945), JBits CPU 820 stops the system clock on reconfigurable logic 810 (step 950) and specifies a pattern-matching circuit for the new CAM entry by modifying the saved bitstream of step 940. The ability of the JBits API to modify only a portion of the bitstream reduces the time required to obtain the new bitstream including data corresponding to the recent CAM entry. The new bitstream is then used to reconfigure reconfigurable logic 810 (step 930). The FPGA system clock is again enabled (step 935) and the new bitstream stored for later modification. In an alternative embodiment, the bitstream is not saved externally. Instead, CPU 820 reads back the configuration bitstream from reconfigurable logic 810 prior to each configuration modification.

Figure 10:
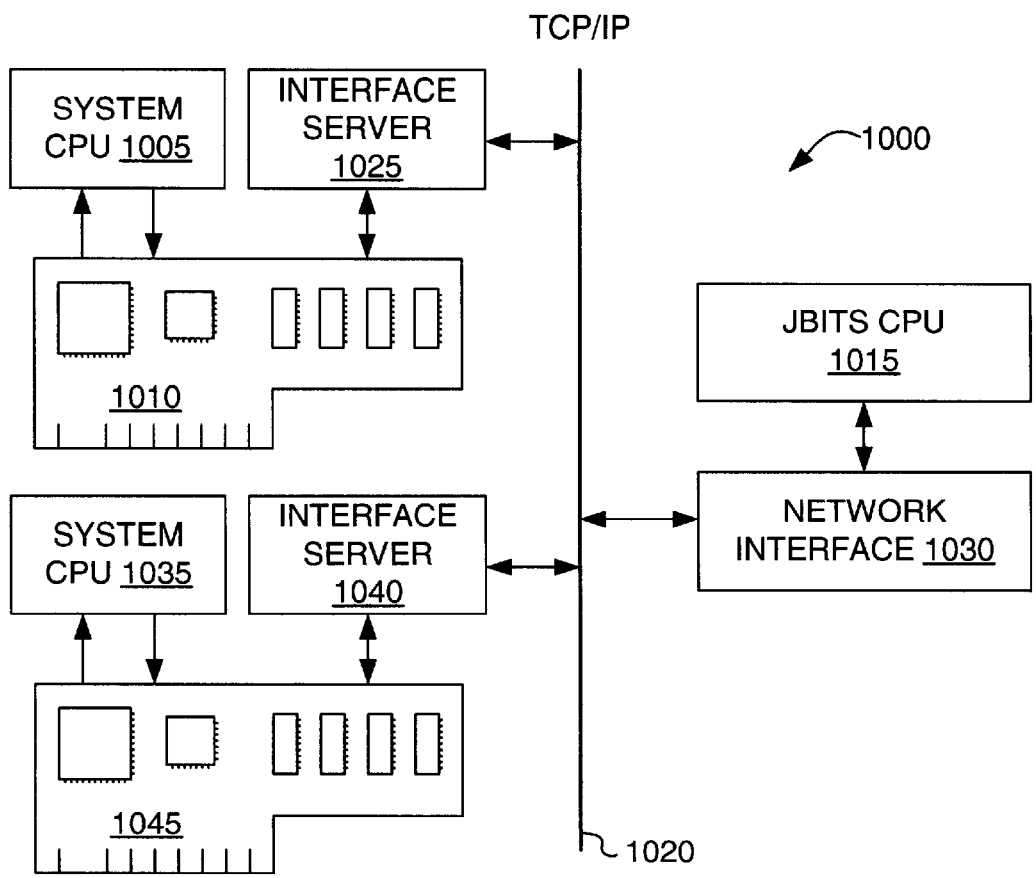
FIG. 10 depicts a network system 1000 in which a system CPU 1005 employs a CAM instantiated in reconfigurable logic 1010.

FIG. 10 depicts a network system 1000 in which a system CPU 1005 employs a CAM instantiated, in part, in reconfigurable logic 1010. System 1000 is similar to system 800 of FIG. 8. However, where reconfigurable logic 810 receives CAM configuration data from a local processor 820, reconfigurable logic 1010 receives CAM configuration data from a remote CPU 1015 over a network connection 1020. An interface server 1025 and a network interface 1030 facilitate this connection. In one embodiment, the network connection uses the standard TCP/IP protocol, but other communication protocols may also be used.

Network interface 1030 can be supplied with the above-mentioned XHWIF hardware interface from Xilinx, Inc. Network interface 1030 permits applications to run, unmodified, on hardware at some remote location. CAM configuration data can therefore be provided remotely. This feature advantageously allows a single source of CAM configuration data to update more than one remote pattern-matching circuit. To illustrate this point, system 1000 includes a second system CPU 1035, a second interface server 1040, and a second set of reconfigurable logic 1045. CPU 1015 can respond to instructions from CPU 1005, CPU 1035, or some other source, to update the CAM entries in reconfigurable logic 1010 and 1045. Moreover, the CAM entries in reconfigurable logic 1010 and 1045 can be maintained as identical or different, as desired for a specified application.

The use of run-time reconfiguration to construct, program and reprogram a CAM results in some significant overall system savings. In general, both the hardware and the software are greatly simplified. Most of the savings accrue from being able to directly reconfigure the programmable logic, rather than having to write them directly as in standard RAM circuits. Reconfiguration, rather than direct access to the stored CAM data, first eliminates all of the read/write access circuitry. This includes the decode logic to decode each address, the wiring necessary to broadcast these addresses, the data busses for reading and writing the data, and the IOBs used to communicate with external hardware. This interface portion of the CAM circuitry is substantial, both in size and complexity. Busses typically consume tri-state lines, which are often scarce. Depending on the addressing scheme, tens of IOBs will be consumed. IOBs also tend to be scarce. The address decoders are also somewhat problematic, often requiring special-purpose logic for efficient implementation. In addition, the bus interface is typically the most timing sensitive portion of the circuit, and therefore requires careful design and simulation. These problems are reduced or eliminated with the use of reconfigurable CAM (RCAM) in accordance with the invention.

Another benefit of RCAM is that system software is simplified. In a standard bus interface approach, device drivers and libraries must be written, debugged, and maintained to access the CAM. This software must be ported to the new platform when the system software or processor changes. With the RCAM, all interfacing is performed through an existing configuration port, at no additional overhead.

The cost of using a configuration port rather than direct hardware access is primarily one of setup speed. Direct writes can typically be done in some small number of system cycles. Reconfiguration to update configuration data may take substantially longer, depending on the implementation. Partial reconfiguration in devices such as Virtex FPGAs permits changes to be made more rapidly than in devices that must be fully reprogrammed to alter their configuration; in either case, however, the setup speed may be orders of magnitude slower then direct hardware approaches. Thus, the RCAM approach favors applications with slowly changing data sets.

Those skilled in the art will appreciate that the invention may be practiced with other system configurations, including hand-held devices, multiprocessor systems, microprocessor-based or programmable consumer electronics, network PCs, minicomputers, mainframe computers, and the like. Further, in embodiments practiced in distributed computing environments, program modules may be located in both local and remote memory storage devices.

While the present invention has been described in connection with specific embodiments, variations of these embodiments will be obvious to those of ordinary skill in the art. For example, while each of the foregoing embodiments employs LUTs for pattern-matching, other types of programmable logic can also be used. Therefore, the spirit and scope of the appended claims should not be limited to the foregoing description.

What is claimed is:

1. A system comprising:
   a. a programmable logic device (PLD) having:
      i. a PLD configuration port adapted to receive configuration data;
      ii. configuration memory cells connected to the configuration port and to the configurable logic resources, the configuration memory containing a first set of configuration data defining a content-addressable memory (CAM), the CAM including:
         (1) a data bus having a plurality of data lines;
         (2) a first configurable look-up table (LUT) having a first plurality of LUT input terminals and a first LUT output terminal, wherein the first LUT input terminals connect to respective ones of the data lines, and wherein the first LUT is configured to output a first match signal on the first LUT output terminal in response to a first bit pattern presented on the data bus;
         (3) a second configurable look-up table (LUT) having a second plurality of LUT input terminals and a second LUT output terminal, wherein the second LUT input terminals connect to respective ones of the data lines, and wherein the second LUT is configured to output a second match signal on the second LUT output terminal in response to a second bit pattern presented on the data bus; and
   b. a processor having a configuration output port connected to the PLD configuration port, the processor adapted to present a second set of configuration data to the PLD configuration port;

c. wherein the configuration memory, upon being presented the second set of configuration data on the configuration port, stores the second set of configuration data; and
   d. wherein the second set of configuration data configures the first LUT to output the first match signal on the first LUT output terminal in response to a third bit pattern presented on the data bus.

2. The system of claim 1, further comprising a decoder having first and second decoder input terminals and a decoder output bus, wherein the decoder input terminals connect to respective ones of the first and second LUT output terminals.

3. The system of claim 2, wherein the decoder is adapted to provide a first address on the decoder output bus in response to the first match signal and to provide a second address on the decoder output bus in response to the second match signal.

4. The system of claim 1, wherein more than half of the first LUT input terminals connect to respective ones of the data lines.

5. The system of claim 1, wherein the first programmable LUT comprises an array of smaller LUTS.

6. The system of claim 5, wherein a first subset of the first plurality of LUT input terminals connects to a first one of the smaller LUTs and a second subset of the first plurality of LUT input terminals connects to a second one of the smaller LUTs.

7. The system of claim 6, wherein the first and second smaller LUTs include respective first and second smaller-LUT output terminals, and wherein a third smaller-LUT selected from the array of smaller LUTs includes first and second input terminals connected to the respective first and second smaller-LUT output terminals.

8. A system comprising:
   a. a programmable logic device (PLD) having:
      i. configurable logic resources;
      ii. a PLD configuration port adapted to receive configuration data;
      iii. configuration memory cells connected to the configuration port and to the configurable logic resources, the configuration memory containing the first set of configuration data defining a content-addressable memory (CAM), the CAM including:
         (1) a data bus having a plurality of data lines;
         (2) a first portion of the configurable logic having a first plurality of data terminals, each connected to a respective one of the data lines, and a first output terminal, wherein the first portion is configured to output a first match signal on the first output terminal in response to a first bit pattern presented on the data bus;
         (3) a second portion of the configurable logic having a second plurality of data terminals, each connected to a respective one of the data lines, and a second output terminal, wherein the second portion is configured to output a second match signal on the second output terminal in response to a second bit pattern presented on the data bus;
   b. a processor having a configuration output port connected to the PLD configuration port, the processor adapted to present a second set of configuration data to the PLD configuration port;

c. wherein the configuration memory, upon being presented the second set of configuration data on the configuration port, stores the second set of configuration data; and d. wherein the second set of configuration data configures the first portion to output the first match signal on the first output terminal in response to a third bit pattern presented on the data bus.

9. The system of claim 8, further comprising a decoder having first and second decoder input terminals and a decoder output bus, wherein the decoder input terminals connect to respective ones of the first and second output terminals.

10. The system of claim 9, wherein the decoder is adapted to provide a first address on the decoder output bus in response to the first match signal and to provide a second address on the decoder output bus in response to the second match signal.

* * * * *